United States Patent
Li et al.

(10) Patent No.: US 12,206,029 B2
(45) Date of Patent: Jan. 21, 2025

(54) DIODE STRUCTURE AND SEMICONDUCTOR DEVICE

(71) Applicant: Vanguard International Semiconductor Corporation, Hsinchu (TW)

(72) Inventors: Jing-Da Li, Kaohsiung (TW); Kai-Chuan Kan, Hsinchu (TW); Chung-Ren Lao, Taichung (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 338 days.

(21) Appl. No.: 17/694,632

(22) Filed: Mar. 14, 2022

(65) Prior Publication Data

US 2023/0290884 A1    Sep. 14, 2023

(51) Int. Cl.
*H01L 29/861* (2006.01)
*H01L 29/06* (2006.01)
*H01L 29/40* (2006.01)

(52) U.S. Cl.
CPC ........ *H01L 29/861* (2013.01); *H01L 29/0692* (2013.01); *H01L 29/404* (2013.01)

(58) Field of Classification Search
CPC . H01L 29/861; H01L 29/0692; H01L 29/404; H01L 29/0649; H01L 29/0619; H01L 29/66128; H01L 29/8611; H01L 29/66204; H01L 29/66212; H01L 29/66106; H01L 29/66143; H01L 29/66136; H01L 29/66151; H01L 29/66356; H01L 29/66393; H01L 27/0814; H01L 27/0817; H01L 27/102; H01L 27/0255; H01L 27/0629; H01L 27/0623; H01L 27/0641; H01L 29/0642; H01L 29/063; H01L 29/0882; H01L 29/0634; H01L 29/0623; H01L 29/0646; H01L 29/0865; H01L 29/0878; H01L 29/1095; H01L 27/088; H01L 27/0922; H01L 27/1225; H01L 27/108; H01L 27/1156;
(Continued)

(56) References Cited

U.S. PATENT DOCUMENTS 5,376,816 A * 12/1994 Nishigoori .......... H01L 27/0623
                                                          257/373
9,543,454 B1 *  1/2017 Lin ................... H01L 21/76264
(Continued)

FOREIGN PATENT DOCUMENTS

TW             201916349 A      4/2019

*Primary Examiner* — Natalia A Gondarenko
(74) *Attorney, Agent, or Firm* — Winston Hsu (57) ABSTRACT

A diode structure includes a substrate having a first conductivity type, a first well region having a second conductivity type opposite to the first conductivity type and disposed in the substrate, a first doped region having the first conductivity type and disposed in the first well region, a ring-shaped well region having the second conductivity type, disposed in the first well region and surrounding the first doped region, an anode disposed on the first doped region, a second well region having the second conductivity type, separated from the first well region and disposed in the substrate, a second doped region having the second conductivity type and disposed in the second well region, and a cathode disposed on the second doped region.

18 Claims, 7 Drawing Sheets

(58) Field of Classification Search
CPC ............ H01L 29/1045; H01L 29/4238; H01L 29/42368; H01L 29/66659; H01L 29/66674; H01L 29/66681; H01L 29/0653; H01L 29/0696; H01L 29/7823; H01L 29/7802; H01L 29/7833; H01L 29/7835; H01L 29/0852; H01L 29/402; H01L 29/7846; H01L 29/7848; H01L 29/78624; H01L 29/7801
USPC ................................ 257/288, 370, 493, 565
See application file for complete search history.

(56) References Cited

U.S. PATENT DOCUMENTS

| | | | |
|---|---|---|---|
| 9,666,699 B1 * | 5/2017 | Hung | H01L 21/76264 |
| 10,475,885 B2 * | 11/2019 | Deivasigamani | H01L 29/7816 |
| 10,580,906 B1 * | 3/2020 | Dinh | H01L 29/861 |
| 2010/0264508 A1 * | 10/2010 | Stecher | H01L 29/78 438/430 |
| 2013/0193491 A1 * | 8/2013 | Salman | H01L 29/808 257/272 |
| 2013/0248947 A1 | 9/2013 | Kim | |
| 2016/0141358 A1 * | 5/2016 | Salcedo | H01L 27/0248 257/168 |
| 2019/0140071 A1 * | 5/2019 | Mun | H01L 29/872 |
| 2019/0319024 A1 * | 10/2019 | Noh | H01L 27/0262 |
| 2020/0013885 A1 * | 1/2020 | Stefanov | H01L 29/0692 |

* cited by examiner

DIODE STRUCTURE AND SEMICONDUCTOR DEVICE

BACKGROUND OF THE INVENTION

1. Field of the Invention

The present disclosure relates generally to diode structures, and more particularly to diode structures applied for high-voltage semiconductor devices.

2. Description of the Prior Art

In recent years, as the developments of electronic products in various fields, high-voltage integrated circuit (HVIC) chips are also widely used. The HVIC chips are usually used as drivers, for example, to drive power metal-oxide-semiconductor field-effect transistors (power MOSFETs) or bipolar junction transistors (BJT), where a bootstrap circuit constructed of a bootstrap diode and a capacitor is usually used to add the capacitor discharge voltage and the power supply voltage, thereby increasing the voltage to provide a required potential for a gate in a high-voltage driving circuit.

However, the conventional bootstrap diode cannot satisfy the requirements of high-voltage integrated circuit chips in all aspects, so it is necessary to improve the conventional bootstrap diode.

SUMMARY OF THE INVENTION

In view of this, the present disclosure provides an improved diode structure and a semiconductor device including the diode structure. The diode structure achieves both high breakdown voltage and low substrate leakage current, which is suitable for high voltage integrated circuit chips, for example, the diode structure is used as a bootstrap diode. Moreover, the diode structure is also integrated with the process of fabricating a bipolar junction transistor (BJT), a complementary metal-oxide-semiconductor (CMOS) transistor and a double-diffused metal-oxide-semiconductor (DMOS) transistor, i.e., a BCD process, and fabricated in the same substrate.

According to one embodiment of the present disclosure, a diode structure is provided and includes a substrate, a first well region, a first doped region, a ring-shaped well region, an anode, a second well region, a second doped region and a cathode. The substrate has a first conductivity type. The first well region has a second conductivity type opposite to the first conductivity type and is disposed in the substrate. The first doped region has the first conductivity type and is disposed in the first well region. The ring-shaped well region has the second conductivity type, is disposed in the first well region, and surrounds the first doped region. The anode is disposed on the first doped region. The second well region has the second conductivity type, is separated from the first well region, and is disposed in the substrate. The second doped region has the second conductivity type and is disposed in the second well region. The cathode is disposed on the second doped region.

According to one embodiment of the present disclosure, a semiconductor device is provided and includes the aforementioned diode structure and a transistor structure. The transistor structure includes a bipolar junction transistor, a complementary metal-oxide-semiconductor transistor or a double-diffused metal-oxide-semiconductor transistor. The transistor structure and the diode structure are disposed together in the same substrate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features may not be drawn to scale. In fact, the dimensions of the various features may be arbitrarily increased or reduced for clarity of discussion.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "under," "lower," "over," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

Furthermore, as disclosed herein, the terms "coupled to" and "electrically connected to" include any directly and indirectly electrical connecting means. Therefore, if it is described in this document that a first component is coupled or electrically connected to a second component, it means that the first component may be directly connected to the second component, or may be indirectly connected to the second component through other components or other connecting means.

Although the disclosure is described with respect to specific embodiments, the principles of the disclosure, as defined by the claims appended herein, can obviously be applied beyond the specifically described embodiments of the disclosure described herein. Moreover, in the description of the present disclosure, certain details have been left out in order to not obscure the inventive aspects of the disclosure. The details left out are within the knowledge of a person having ordinary skill in the art.

The present disclosure relates to a diode structure suitable for high-voltage applications, and a semiconductor device including the diode structure. The diode structure achieves both high breakdown voltage and low substrate leakage current, and is suitable for high-voltage integrated circuit chips, for example, the diode structure is used as a bootstrap diode. Moreover, the diode structure is also integrated with the process of fabricating a bipolar junction transistor (BJT), a complementary metal-oxide-semiconductor (CMOS) transistor and a double-diffused metal-oxide-semiconductor (DMOS) transistor, i.e., a BCD process. The diode structure and the aforementioned transistors are fabricated in the same substrate together to complete the semiconductor device.

Figure 1:
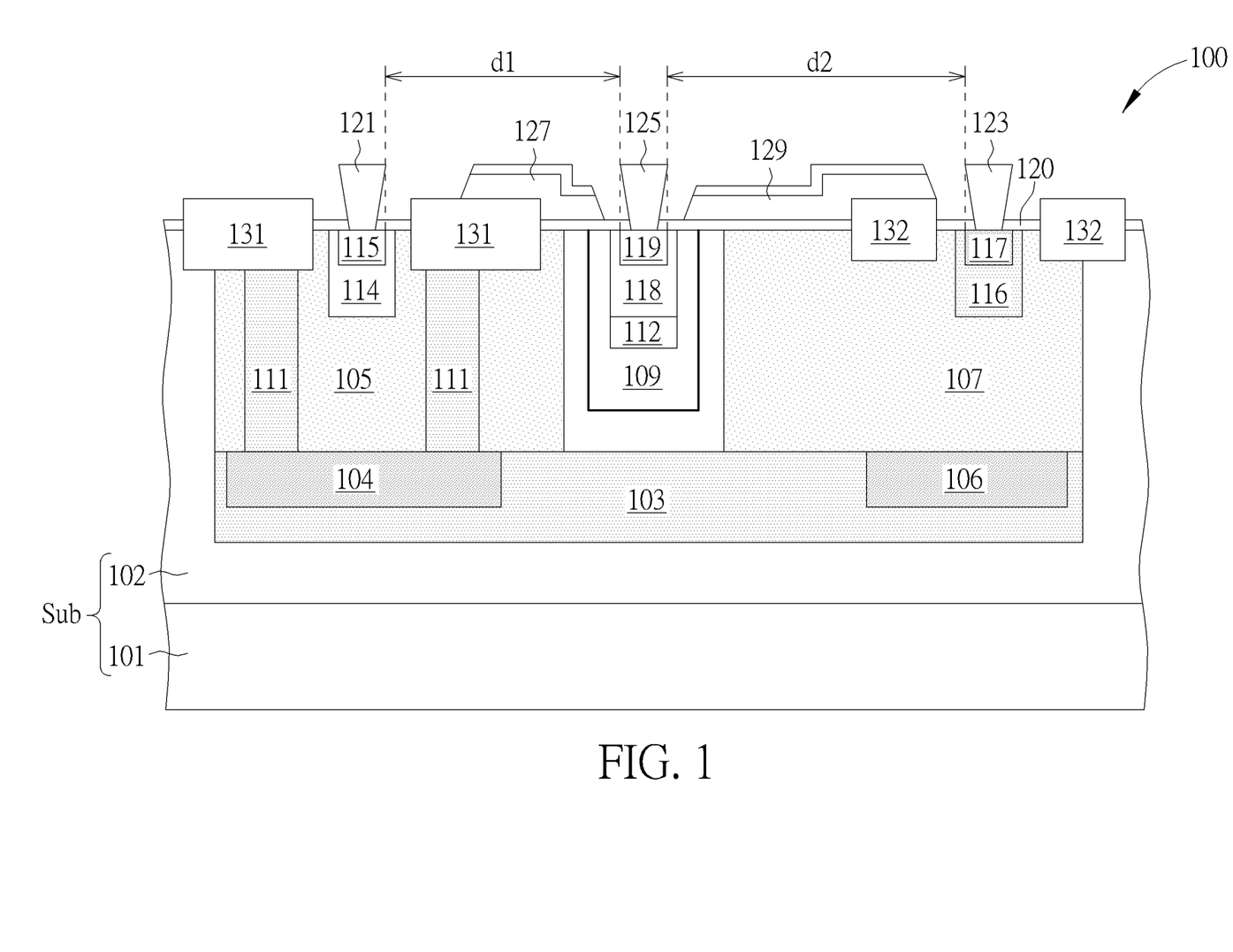
FIG. 1 is a schematic cross-sectional view of a diode structure according to an embodiment of the present disclosure.

FIG. 1 is a schematic cross-sectional view of a diode structure according to an embodiment of the present disclosure. As shown in FIG. 1, in one embodiment, a diode structure 100 includes a carrier substrate 101 and an epitaxial layer 102 formed on the carrier substrate 101. The carrier substrate 101 and the epitaxial layer 102 may be collectively referred to as a substrate Sub, and the substrate Sub has a first conductivity type, such as a p-type substrate. In some embodiments, the carrier substrate 101 is a semiconductor substrate having the first conductivity type, such as a p-type silicon substrate (P-Sub), and the epitaxial layer 102 is a semiconductor epitaxial layer having the first conductivity type, such as p-type silicon epitaxial layer (P-Epi). In one embodiment, the substrate Sub may be electrically connected to a ground terminal. In addition, the diode structure 100 includes a first well region 105 disposed in the substrate Sub. The first well region 105 has a second conductivity type opposite to the first conductivity type, such as an n-type high-voltage well region (high-voltage n-well, HVNW), and is disposed in the epitaxial layer 102 of the substrate Sub. The top surface of the first well region 105 and the top surface of the epitaxial layer 102 may be on the same plane, and the bottom surface of the first well region 105 may be located at a depth in the epitaxial layer 102.

The diode structure 100 further includes a first doped region 115 having the first conductivity type, such as a p-type heavily doped region ($P^+$ doped region). The first doped region 115 is disposed in the first well region 105. The top surface of the first doped region 115 and the top surface of the first well region 105 may be on the same plane, and the bottom surface of the first doped region 115 may be located at a depth in the first well region 105. An anode 121 of the diode structure 100 is disposed on the first doped region 115 and in contact with the top surface of the first doped region 115. The first doped region 115 may be used as a contact region for the anode 121. According to an embodiment of the present disclosure, the diode structure 100 includes a ring-shaped well region 111 having the second conductivity type, such as an n-type deep high-voltage well region (deep high-voltage n-well, DHVNW). The ring-shaped well region 111 is disposed in the first well region 105 and surrounds the first doped region 115. The doping concentration of the ring-shaped well region 111 is higher than the doping concentration of the first well region 105. The bottom surface of the ring-shaped well region 111 and the bottom surface of the first well region 105 may be on the same plane. In some embodiments, the doping concentration of the first well region 105 is about 50E11 to 48E12 atoms/cm$^3$, and the doping concentration of the ring-shaped well region 111 is about 80E11 to 80E12 atoms/cm$^3$.

The diode structure 100 further includes a second well region 107 having the second conductivity type. The second well region 107 is separated from the first well region 105 and disposed in the substrate Sub. The second well region 107 is, for example, an n-type high-voltage well region (HVNW), and disposed in the epitaxial layer 102 of the substrate Sub. The top surface of the second well region 107 and the top surface of the epitaxial layer 102 may be on the same plane, and the bottom surface of the second well region 107 and the bottom surface of the first well region 105 may be at the same depth in the epitaxial layer 102. The second well region 107 and the first well region 105 are separated by a distance in the horizontal direction. In one embodiment, the doping concentration of the second well region 107 may be the same as or lower than the doping concentration of the first well region 105. In addition, the diode structure 100 further includes a second doped region 117 having the second conductivity type and disposed in the second well region 107. The second doped region 117 is, for example, an n-type heavily doped region ($N^+$ doped region). The top surface of the second doped region 117 and the top surface of the second well region 107 may be on the same plane, and the bottom surface of the second doped region 117 may be at a depth in the second well region 107. A cathode 123 of the diode structure 100 is disposed on the second doped region 117 and in contact with the top surface of the second doped region 117. The second doped region 117 may be used as a contact region for the cathode 123.

According to an embodiment of the present disclosure, the diode structure 100 further includes a third well region 109 having the first conductivity type, disposed in the substrate Sub, and located between the first well region 105 and the second well region 107. The third well region 109 is separated from the first well region 105 and the second well region 107. The third well region 109 is, for example, a p-type high-voltage well region (high-voltage p-well, HVPW), and disposed in the epitaxial layer 102 of the substrate Sub. The top surface of the third well region 109 and the top surfaces of the first well region 105 and the second well region 107 may be on the same plane, and the bottom surface of the third well region 109 is higher than the bottom surfaces of the first well region 105 and the second well region 107. The third well region 109 is separated from the first well region 105 and the second well region 107 by a distance in the horizontal direction. In addition, the diode structure 100 further includes a third doped region 119 having the first conductivity type and disposed in the third well region 109. The third doped region 119 is, for example, a p-type heavily doped region ($P^+$ doped region). The top surface of the third doped region 119 and the top surface of the third well region 109 may be on the same plane, and the bottom surface of the third doped region 119 may be located at a depth in the third well region 109, for example, the bottom surface of the third doped region 119 and the bottom surface of the first doped region 115 may be at the same depth. A ground electrode 125 of the diode structure 100 is disposed on the third doped region 119 and in contact with the top surface of the third doped region 119. The third doped region 119 may be used as a contact region for the ground electrode 125. According to the embodiments of the present disclosure, by using the ground electrode 125, the pinch-off voltage between the first well region 105 and the third well region 109 may be controlled more precisely, and the pinch-off voltage between the second well region 107 and the third well region 109 may also be controlled more precisely.

According to an embodiment of the present disclosure, a first distance d1 is between the first doped region 115 and the third doped region 119, and a second distance d2 is between the second doped region 117 and the third doped region 119. The second distance d2 is greater than or equal to the first distance d1. In some embodiments, the second distance d2 is about 1 to 2 times the first distance d1, for example, about 1.5 times the first distance d1.

In some embodiments, the diode structure 100 may optionally include a fourth doped region 114 having the first conductivity type, such as a p-type well region (PW), and disposed in the first well region 105. In addition, the first doped region 115 is disposed in the fourth doped region 114, where the doping concentration of the first doped region 115 is higher than the doping concentration of the fourth doped region 114. The top surface of the fourth doped region 114 and the top surface of the first doped region 115 may be on the same plane, and the bottom surface of the fourth doped region 114 may be located at a depth in the first well region 105. The bottom surface of the ring-shaped well region 111 is lower than the bottom surface of the fourth doped region 114, and the bottom surface of the fourth doped region 114 is lower than the bottom surface of the first doped region 115. The ring-shaped well region 111 also surrounds the fourth doped region 114.

The diode structure 100 may also optionally include a fifth doped region 116 having the second conductivity type, such as an n-type well region (NW), and disposed in the second well region 107. In addition, the second doped region 117 is disposed in the fifth doped region 116, where the doping concentration of the second doped region 117 is higher than the doping concentration of the fifth doped region 116. The top surface of the fifth doped region 116 and the top surface of the second doped region 117 may be on the same plane, and the bottom surface of the fifth doped region 116 is located at a depth in the second well region 107, where the bottom surface of the fifth doped region 116 is lower than the bottom surface of the second doped region 117.

In addition, the diode structure 100 may optionally include a sixth doped region 118 having the first conductivity type, such as a p-type well region (PW), and disposed in the third well region 109. The third doped region 119 is disposed in the sixth doped region 118, where the doping concentration of the third doped region 119 is higher than the doping concentration of the sixth doped region 118. The top surface of the sixth doped region 118 and the top surface of the third doped region 119 may be on the same plane, and the bottom surface of the sixth doped region 118 and the bottom surface of the fourth doped region 114 may be at the same depth, where the bottom surface of the sixth doped region 118 is lower than the bottom surface of the third doped region 119. In addition, the diode structure 100 may optionally include a seventh doped region 112 having the first conductivity type, for example, a p-type top layer (PTOP), disposed in the third well region 109 and located under the sixth doped region 118. The doping concentration of the seventh doped region 112 is higher than the doping concentration of the sixth doped region 118, and lower than the doping concentration of the third doped region 119. In one embodiment, the top surface of the seventh doped region 112 may be in contact with the bottom surface of the sixth doped region 118, and the vertical projection area of the seventh doped region 112 may substantially correspond to the vertical projection area of the sixth doped region 118. The bottom surface of the seventh doped region 112 is located at a depth in the third well region 109, and the bottom surface of the seventh doped region 112 is lower than the bottom surfaces of the fourth doped region 114, the fifth doped region 116 and the sixth doped region 118.

The diode structure 100 may further include a first buried layer 104 having the second conductivity type, disposed under the first well region 105, and in contact with the ring-shaped well region 111. The first buried layer 104 is, for example, an n-type heavily doped buried layer ($N^+$ buried layer, NBL+). The doping concentration of the first buried layer 104 is higher than the doping concentration of the first well region 105, and the doping concentration of the first buried layer 104 may be substantially the same as or higher than the doping concentration of the ring-shaped well region 111. In some embodiments, the doping concentration of the first buried layer 104 is about 50E12 to 20E13 atoms/cm$^3$. According to the embodiments of the present disclosure, the top surface of the first buried layer 104 is in contact with the bottom surface of the ring-shaped well region 111 to form a cylindrical structure with a closed bottom surface to surround the first doped region 115. In addition, the vertical projection area of the first buried layer 104 covers the vertical projection area of the ring-shaped well region 111, for example, the boundary of the vertical projection area of the first buried layer 104 exceeds the boundary of the vertical projection area of the ring-shaped well region 111. According to the embodiments of the present disclosure, through the ring-shaped well region 111 and the first buried layer 104, when the diode structure 100 is applied with a forward voltage, the current from the anode 121 is effectively prevented from passing through the first well region 105 and flowing to the substrate Sub, thereby achieving low substrate leakage current.

In addition, the diode structure 100 may optionally include a second buried layer 106 having the second conductivity type, and disposed under the second well region 107. The second buried layer 106 is separated from the first buried layer 104. The second buried layer 106 is, for example, an n-type heavily doped buried layer (NBL+). The doping concentration of the second buried layer 106 is higher than the doping concentration of the second well region 107, and the doping concentration of the second buried layer 106 may be the same as the doping concentration of the first buried layer 104. In some embodiments, the top surface of the second buried layer 106 is in contact with the bottom surface of the second well region 107, and the second buried layer 106 and the first buried layer 104 are separated by a distance in the horizontal direction. In addition, the second buried layer 106 corresponds to the second doped region 117 in the vertical projection direction, and the vertical projection area of the second buried layer 106 is larger than the vertical projection area of the second doped region 117. The vertical projection region of the second buried layer 106 covers the vertical projected region of the second doped region 117.

The diode structure 100 may further include a third buried layer 103 disposed in the substrate Sub. The third buried layer 103 has the second conductivity type, such as an n-type buried layer (NBL), and is disposed at a depth in the epitaxial layer 102. In addition, the third buried layer 103 extends laterally from below the first well region 105 to below the second well region 107. The top surface of the third buried layer 103 may be in contact with the bottom surfaces of the first well region 105 and the second well region 107. The vertical projection region of the third buried layer 103 covers the vertical projection regions of the first well region 105, the second well region 107 and the third well region 109. In some embodiments, the first buried layer 104 and the second buried layer 106 are disposed in the third buried layer 103, and the doping concentrations of the first buried layer 104 and the second buried layer 106 are higher than the doping concentration of the third buried layer 103. In addition, the doping concentration of the third buried layer 103 is higher than the doping concentrations of the first well region 105 and the second well region 107. In some embodiments, the top surfaces of the first buried layer 104, the second buried layer 106 and the third buried layer 103 may be on the same plane, and the bottom surfaces of the first buried layer 104 and the second buried layer 106 are higher than the bottom surface of the third buried layer 103.

According to the embodiments of the present disclosure, since the conductivity type of the third buried layer 103 is different from the conductivity type of the third well region 109 and the substrate Sub, when a reverse voltage (for example, a positive voltage) is applied to the cathode 123, the portion of the third buried layer 103 directly under the third well region 109 and between the third well region 109 and the substrate Sub is pinched-off and converted into a depletion region, so that reverse current does not easily flow from the cathode 123 to the anode 121.

The diode structure 100 further includes a first isolation region 131 disposed in the first well region 105 and surrounding the first doped region 115, and a second isolation region 132 disposed in the second well region 107 and surrounding the second doped region 117. The first isolation region 131 is located between the anode 121 and the ground electrode 125, and the second isolation region 132 is located between the cathode 123 and the ground electrode 125, thereby electrically isolating the anode 121, the ground electrode 125 and the cathode 123 from each other. In some embodiments, the first isolation region 131 and the second isolation region 132 are, for example, shallow trench isolation (STI) structures. The first isolation region 131 may correspond to the ring-shaped well region 111 in the vertical projection direction, and is disposed above the ring-shaped well region 111. In some embodiments, the top surface of the first isolation region 131 is higher than the top surface of the first well region 105, and the top surface of the second isolation region 132 is higher than the top surface of the second well region 107.

In addition, the diode structure 100 may optionally include a first field plate 127 extending laterally from above the first well region 105 to above the third well region 109, or further include a second field plate 129 extending laterally from above the second well region 107 to above the third well region 109. In some embodiments, the material of the first field plate 127 and the second field plate 129 may include a conductive material, such as polysilicon. The first field plate 127 and the second field plate 129 may be floating electrodes. The first field plate 127 is located between the anode 121 and the ground electrode 125. The second field plate 129 is located between the cathode 123 and the ground electrode 125. The ground electrode 125 is located between the first field plate 127 and the second field plate 129. In addition, a portion of the first field plate 127 is conformally disposed on the first isolation region 131, and a portion of the second field plate 129 is conformally disposed on the second isolation region 132. According to the embodiments of the present disclosure, the first field plate 127 may suppress the concentration of the surface electric field between the first well region 105 and the third well region 109, and the second field plate 129 may suppress the concentration of the surface electric field between the second well region 107 and the third well region 109. Therefore, through the first field plate 127 and the second field plate 129, the surface electric field distribution of the diode structure 100 may be adjusted to enhance the breakdown voltage of the diode structure 100, and to make the diode structure 100 be more suitable for high voltage applications.

In addition, a dielectric layer 120 is disposed on the surface of the substrate Sub. The dielectric layer 120 is located under the first field plate 127 and the second field plate 129 to separate the first field plate 127 and the second field plate 129 from the substrate Sub. The dielectric layer 120 has openings to expose the first doped region 115, the second doped region 117 and the third doped region 119, such that the anode 121, the cathode 123 and the ground electrode 125 are in contact with the first doped region 115, the second doped region 117 and the third doped region 119 through the openings of the dielectric layer 120. In some embodiments, the material of the dielectric layer 120 may include silicon oxide, silicon nitride, silicon oxynitride or other dielectric materials.

Figure 2:
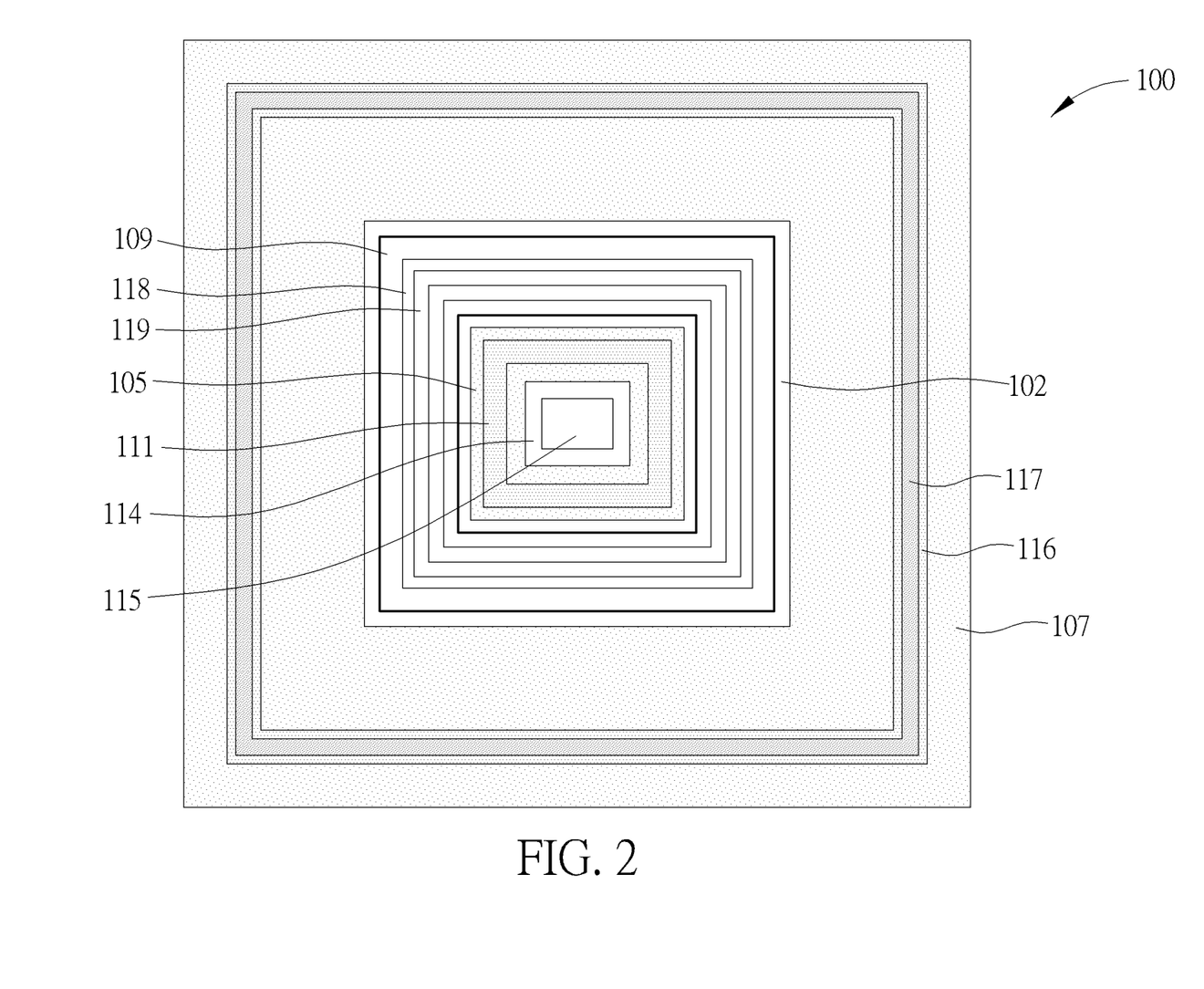
FIG. 2 is a schematic top view of a diode structure according to an embodiment of the present disclosure.

FIG. 2 is a schematic top view of a diode structure according to an embodiment of the present disclosure. In order to simplify the drawing, some features of the diode structure 100 are not shown in FIG. 2. As shown in FIG. 2, in one embodiment, the third doped region 119 of the diode structure 100 is annular to surround the first doped region 115, and disposed between the first doped region 115 and the second doped region 117. In addition, the second doped region 117 of the diode structure 100 is also annular to surround the third doped region 119. Moreover, the third well region 109 of the diode structure 100 is annular to surround the first well region 105. The second well region 107 is also annular to surround the third well region 109. Furthermore, an insulating structure (not shown) may be further disposed around the second well region 107. The insulating structure may surround the second well region 107 to prevent an unnecessary electrical connection between the diode structure 100 and its peripheral elements.

According to the embodiments of the present disclosure, in the diode structure 100, the first well region 105 disposed under the anode 121 and the second well region 107 disposed under the cathode 123 are lightly doped regions, which have a doping concentration of about 50E11 to 48E12 atoms/cm$^3$. Therefore, the diode structure 100 has a high breakdown voltage capable of withstanding a high voltage greater than 100V, for example, withstanding a voltage greater than 120V. In addition, the doping concentrations of the first well region 105 and the second well region 107 may be adjusted according to the voltage requirements of the diode structure 100 applied for various electronic products or circuits. For example, the doping concentrations of the first well region 105 and the second well region 107 may be lightened to make the diode structure 100 withstand higher voltages, so that the diode structure 100 of the present disclosure can withstand various voltages, such as about 0V to 120V.

In addition, according to the embodiments of the present disclosure, the diode structure 100 includes the ring-shaped well region 111 with a doping concentration higher than that of the first well region 105 and surrounding the first doped region 115 disposed under the anode 121. The ring-shaped well region 111 prevents the current in the first well region 105 from flowing to the substrate Sub, so that the diode structure 100 has low substrate leakage current. Moreover, the diode structure 100 further includes the first buried layer 104 in contact with the bottom surface of the ring-shaped well region 111, and the doping concentration of the first buried layer 104 is higher than that of the first well region 105. Through the buried layer 104, the current in the first well region 105 is further prevented from flowing downward to the substrate Sub, thereby improving the low substrate leakage current characteristic of the diode structure 100.

In addition, according to some embodiments of the present disclosure, the second distance d2 between the cathode 123 and the ground electrode 125 is greater than or equal to the first distance d1 between the anode 121 and the ground electrode 125. When the second distance d2 is larger, the breakdown voltage of the diode structure 100 is higher. Therefore, through adjusting the ratio of the second distance d2 to the first distance d1, the voltage requirements of the diode structure 100 applied for various electronic products or circuits are satisfied. In some embodiments, in the diode structure 100, the breakdown voltage (BV) between the second doped region 117 and the third doped region 119 is greater than 100V, the breakdown voltage (BV) between the third doped region 119 and the ring-shaped well region 111 is greater than 80V, and the breakdown voltage (BV) between the first doped region 115 and the ring-shaped well region 111 is greater than 60V.

According to the embodiments of the present disclosure, the left structure of the diode structure 100, i.e., the structure located below the anode 121, mainly controls the operation of on-state, which provides high forward current and low substrate leakage current. The right structure of the diode structure 100, i.e., the structure located below the cathode 123, mainly controls the operation of off-state, which provides a high breakdown voltage to avoid reverse current flowing from the cathode 123 to the anode 121. Therefore, the diode structure 100 of the present disclosure achieves all of the characteristics including high breakdown voltage, high forward current and low substrate leakage current.

Figure 3:
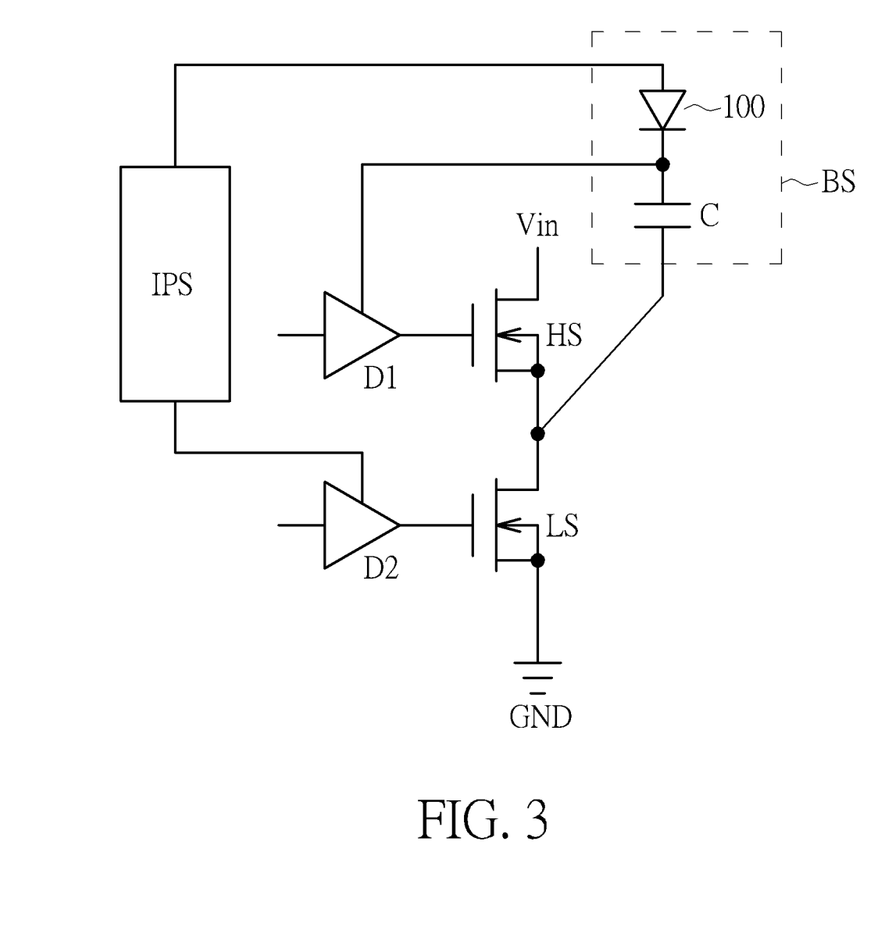
FIG. 3 illustrates a half-bridge circuit including a bootstrap circuit according to an embodiment of the present disclosure.

FIG. 3 illustrates a half-bridge circuit including a bootstrap circuit according to an embodiment of the present disclosure. In general, for the requirement of low on-state resistance (Ron), an n-type metal-oxide-semiconductor transistor (NMOS) is used for a high-voltage switching element HS of a half-bridge circuit, and an NMOS is also used for a low-voltage switching element LS of the half-bridge circuit. In order to use an NMOS as the high-voltage switching element HS and turn it on, the gate-to-source voltage ($V_{GS}$) of the high-voltage switching element HS must be higher than the drain-to-source voltage ($V_{DS}$). The drain voltage of the high-voltage switching element HS is usually an input voltage Vin, which is the highest voltage inside the circuit. Therefore, a voltage higher than the input voltage Vin needs to be generated through a bootstrap circuit BS and provided to the gate of the high-voltage switching element HS.

According to the embodiments of the present disclosure, the diode structure 100 may be used as a bootstrap diode, which is coupled with a capacitor C to form the bootstrap circuit BS. The diode structure 100 controls the flow of the voltage from an internal power supply IPS, and transmits the voltage of the internal power supply IPS to a driver D1. The capacitor C is electrically connected to the node between the high-voltage switching element HS and the low-voltage switching element LS, accumulates charges and transmits the input voltage Vin to the driver D1. The added voltage of the voltage of the internal power supply IPS and the input voltage Vin is provided to the gate of the high-voltage switching element HS through the driver D1, so that the gate-to-source voltage ($V_{GS}$) of the high-voltage switching element HS is higher than the drain-to-source voltage ($V_{DS}$) thereof, and the high-voltage switching element HS using an NMOS is turned on. In addition, in the half-bridge circuit, the gate of the low-voltage switching element LS is electrically connected to another driver D2, and the driver D2 receives the voltage from the internal power supply IPS. The source of the low-voltage switching element LS is electrically connected to a ground terminal GND, and the drain of the low-voltage switching element LS is electrically connected to the source of the high-voltage switching element HS to form the half-bridge circuit. The diode structure 100 of the embodiments of the present disclosure is not only used as a bootstrap diode in the bootstrap circuit BS, but also applied to other high-voltage integrated circuits to meet the needs for both high breakdown voltage and low substrate leakage current.

FIG. 4, FIG. 5, FIG. 6, and FIG. 7 are schematic cross-sectional views of several intermediate stages of fabricating a semiconductor device including a diode structure according to an embodiment of the present disclosure. As shown in FIG. 4, FIG. 5, FIG. 6 and FIG. 7, in one embodiment, a semiconductor device 10 includes the diode structure 100, a transistor structure 200 and a transistor structure 300, where the transistor structures 200 and 300 may include a bipolar junction transistor (BJT), a complementary metal-oxide-semiconductor (CMOS) transistor, or a double-diffused metal-oxide-semiconductor (DMOS) transistor, and the transistor structures 200 and 300 are disposed with the diode structure 100 in the same substrate Sub. According to the embodiments of the present disclosure, the process of fabricating the diode structure 100 may be integrated with the BCD process of fabricating the other transistor structures 200 and 300, no additional photo-mask is required and the aforementioned structures may be fabricated simultaneously, thereby saving the fabrication time and cost of the semiconductor devices.

Figure 4:
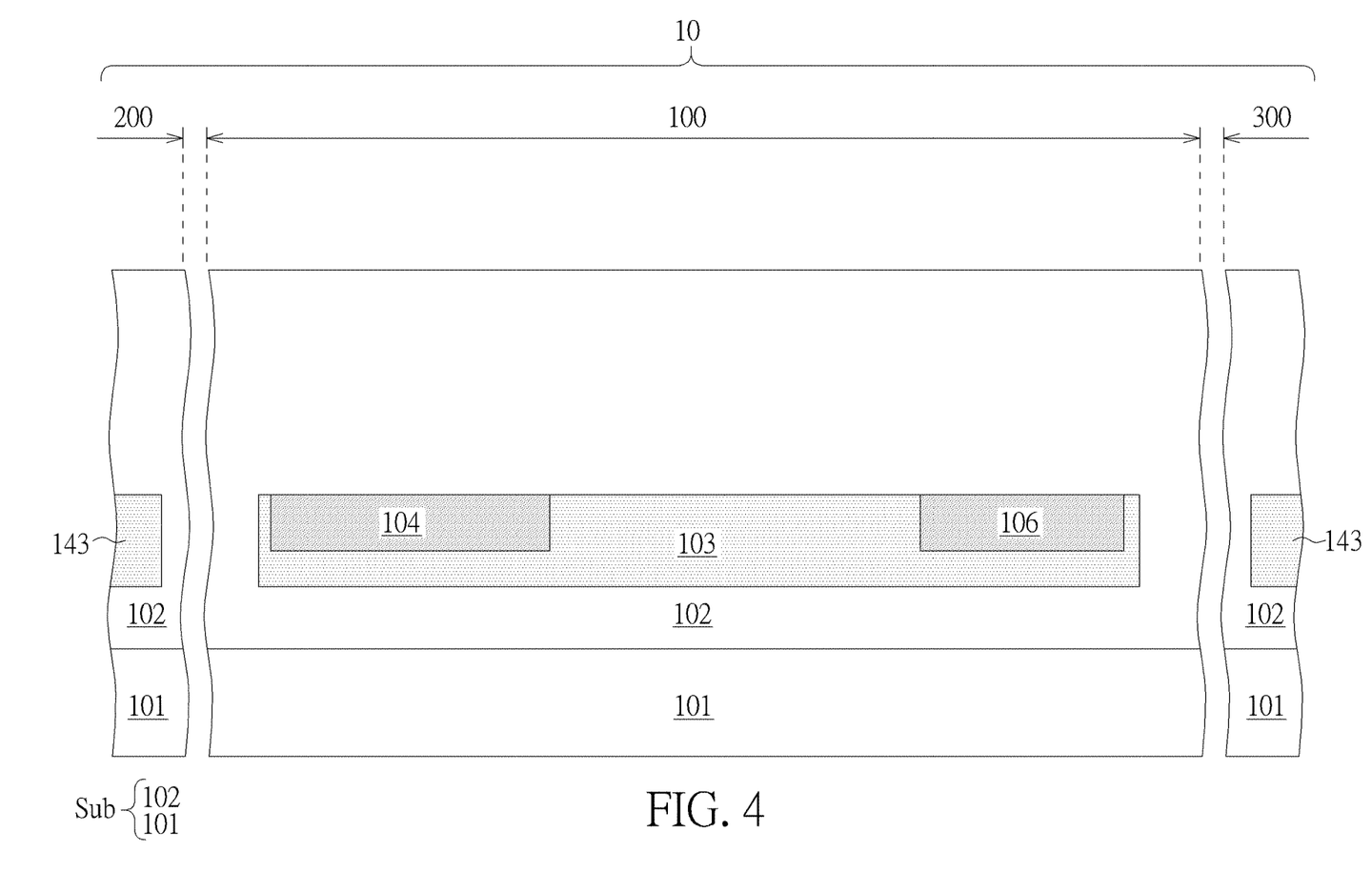
FIG. 4, FIG. 5, FIG. 6, and FIG. 7 are schematic cross-sectional views of several intermediate stages of fabricating a semiconductor device including a diode structure according to an embodiment of the present disclosure.

As shown in FIG. 4, first, a substrate Sub is provided, which includes a carrier substrate 101 and an epitaxial layer 102 formed on the carrier substrate 101. Next, in the epitaxial layer 102 of the substrate, using the same photo-mask and the same ion implantation process, a third buried layer 103 is formed in the region of the diode structure 100, and buried layers 143 having the same conductivity type as that of the buried layer 103 are also formed in the regions of the transistor structures 200 and 300 at the same time. Then, in the region of the diode structure 100, another photo-mask and another ion implantation process are used to form a first buried layer 104 and a second buried layer 106 in the third buried layer 103, where the first buried layer 104 and the second buried layer 106 have a higher doping concentration than that of the third buried layer 103. Although not shown in FIG. 4, the photo-mask and the ion implantation process for forming the first buried layer 104 and the second buried layer 106 may also be used to form the desired heavily doped buried layers in the regions of the transistor structures 200 and 300.

Figure 5:
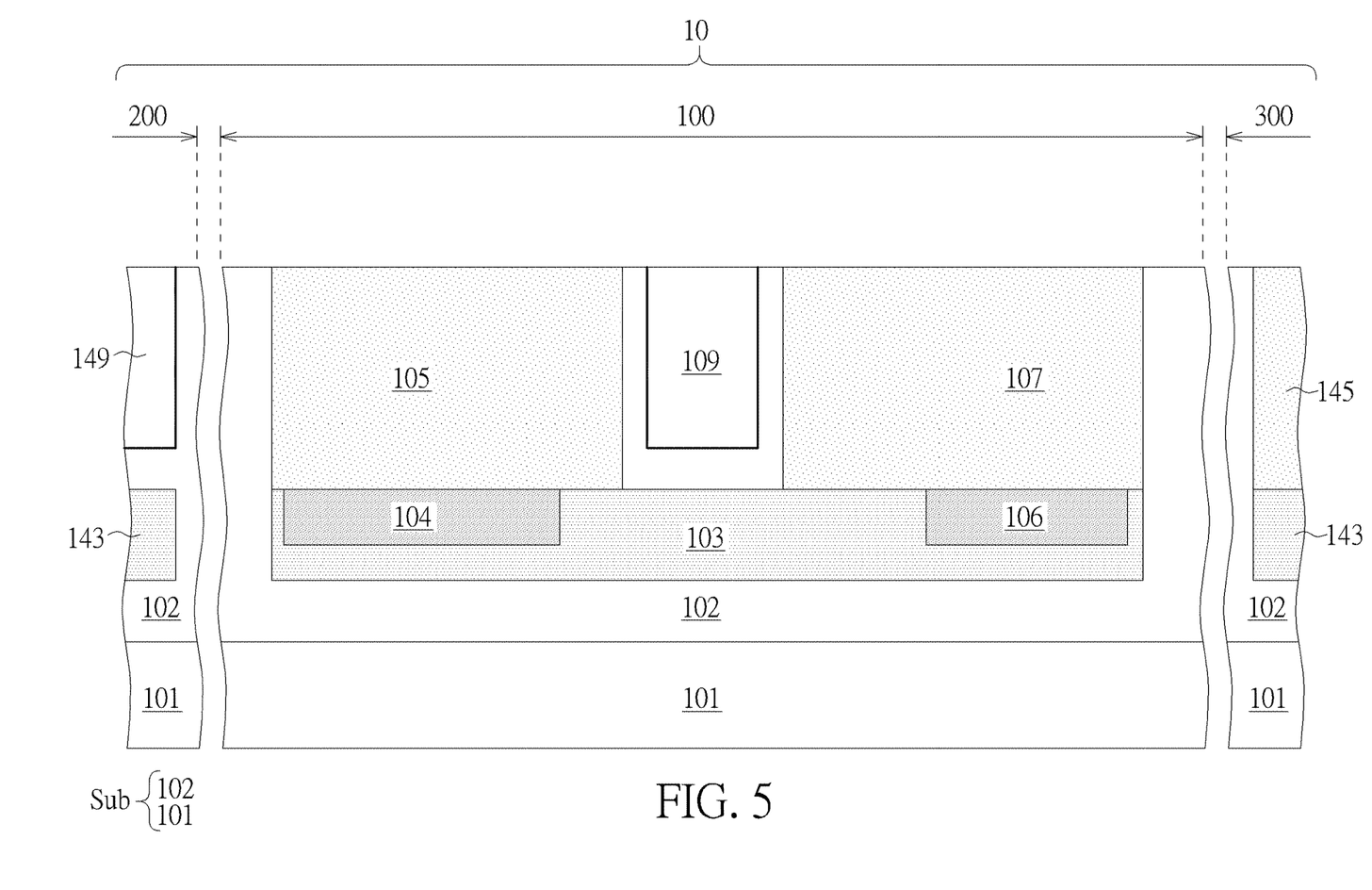

Next, as shown in FIG. 5, in the epitaxial layer 102 of the substrate, the same photo-mask and the same ion implantation process are used to form a first well region 105 and a second well region 107 of the same conductivity type in the region of the diode structure 100, and at the same time, a well region 145 having the same conductivity type as that of the first well region 105 and the second well region 107 is formed in the region of the transistor structure 300. Then, another photo-mask and another ion implantation process are used to form a third well region 109 in the region of the diode structure 100, and at the same time, a well region 149 having the same conductivity type as that of the third well region 109 is formed in the region of the transistor structure 200. In one embodiment, the first well region 105, the second well region 107 and the well region 145 are, for example, n-type well regions, and the well region 145 may be used as a well region of an NMOS in the transistor structure 300. According to embodiments of the present disclosure, the well region 145 of the transistor structure 300 may be formed together with the first well region 105 and the second well region 107 of the diode structure 100 and have the same doping concentration. The third well region 109 and the well region 149 are, for example, p-type well regions. The well region 149 may be used as a well region of a PMOS in the transistor structure 200. The well region 149 of the transistor structure 200 may be formed together with the third well region 109 of the diode structure 100, and have the same doping concentration.

Figure 6:
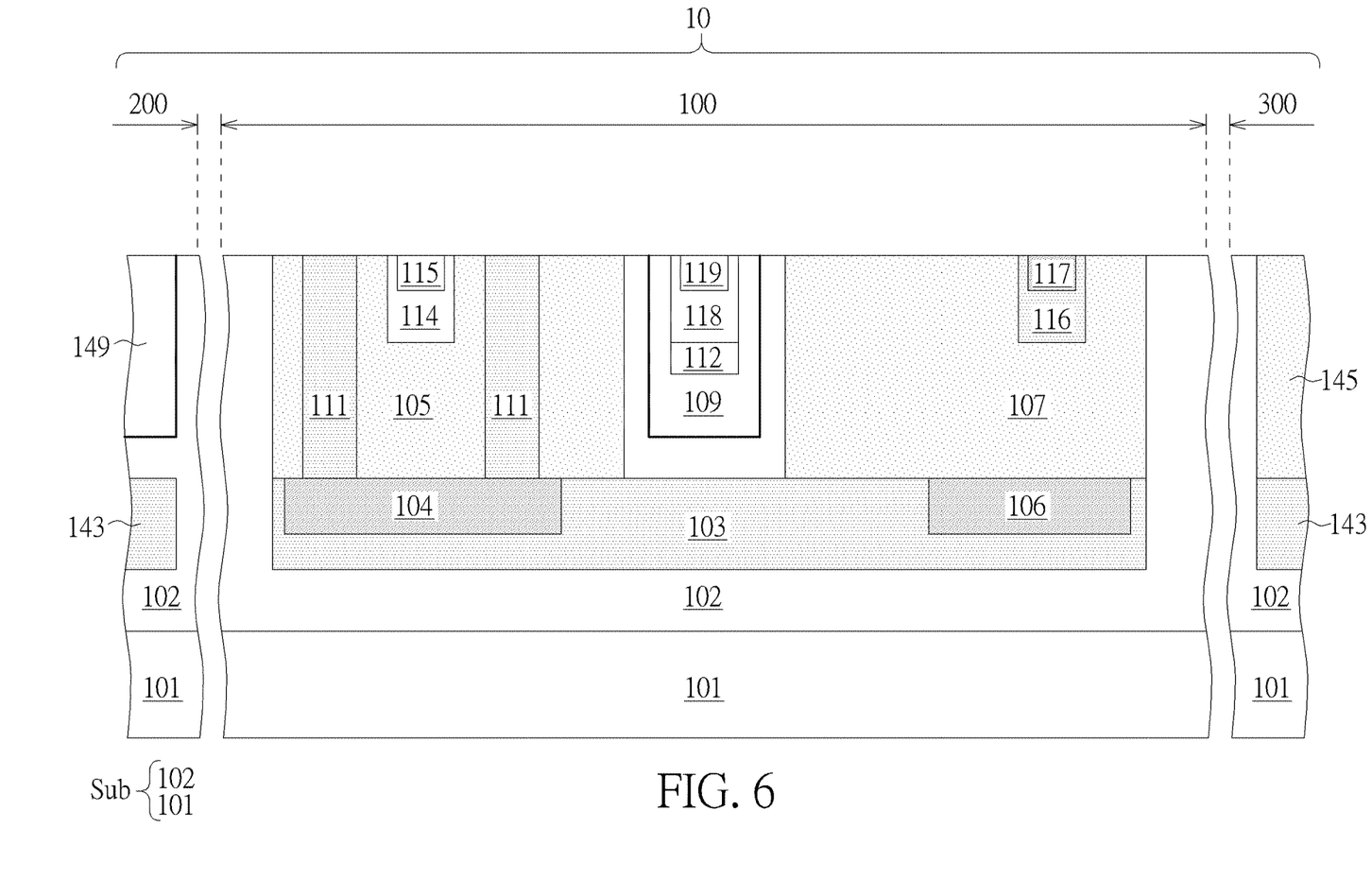

Then, as shown in FIG. 6, in the region of the diode structure 100, a photo-mask and an ion implantation process are used to form a ring-shaped well region 111 in the first well region 105, and two ion implantation processes with different doping concentrations are used to form a fifth doped region 116 with a light doping concentration and a second doped region 117 with a heavily doping concentration in sequence in the second well region 107. Thereafter, a seventh doped region 112 is formed in the third well region 109 of the diode structure 100 by using an ion implantation process. Next, using the same photo-mask and the same ion implantation process, a fourth doped region 114 is formed in the first well region 105 of the diode structure 100, and a sixth doped region 118 is formed in the third well region 109 at the same time. The fourth doped region 114 and the sixth doped region 118 may have the same doping concentration. Then, using another photo-mask and another ion implantation process, a first doped region 115 is formed in the fourth doped region 114 of the diode structure 100, and a third doped region 119 is formed in the sixth doped region 118 at the same time. The first doped region 115 and the third doped region 119 may have the same doping concentration. Although not shown in FIG. 6, the aforementioned photo-masks and ion implantation processes for forming various doped regions in the region of the diode structure 100 may also be applied to the regions of the transistor structures 200 and 300 to simultaneously form various doped regions required for the transistors structures 200 and 300.

Figure 7:
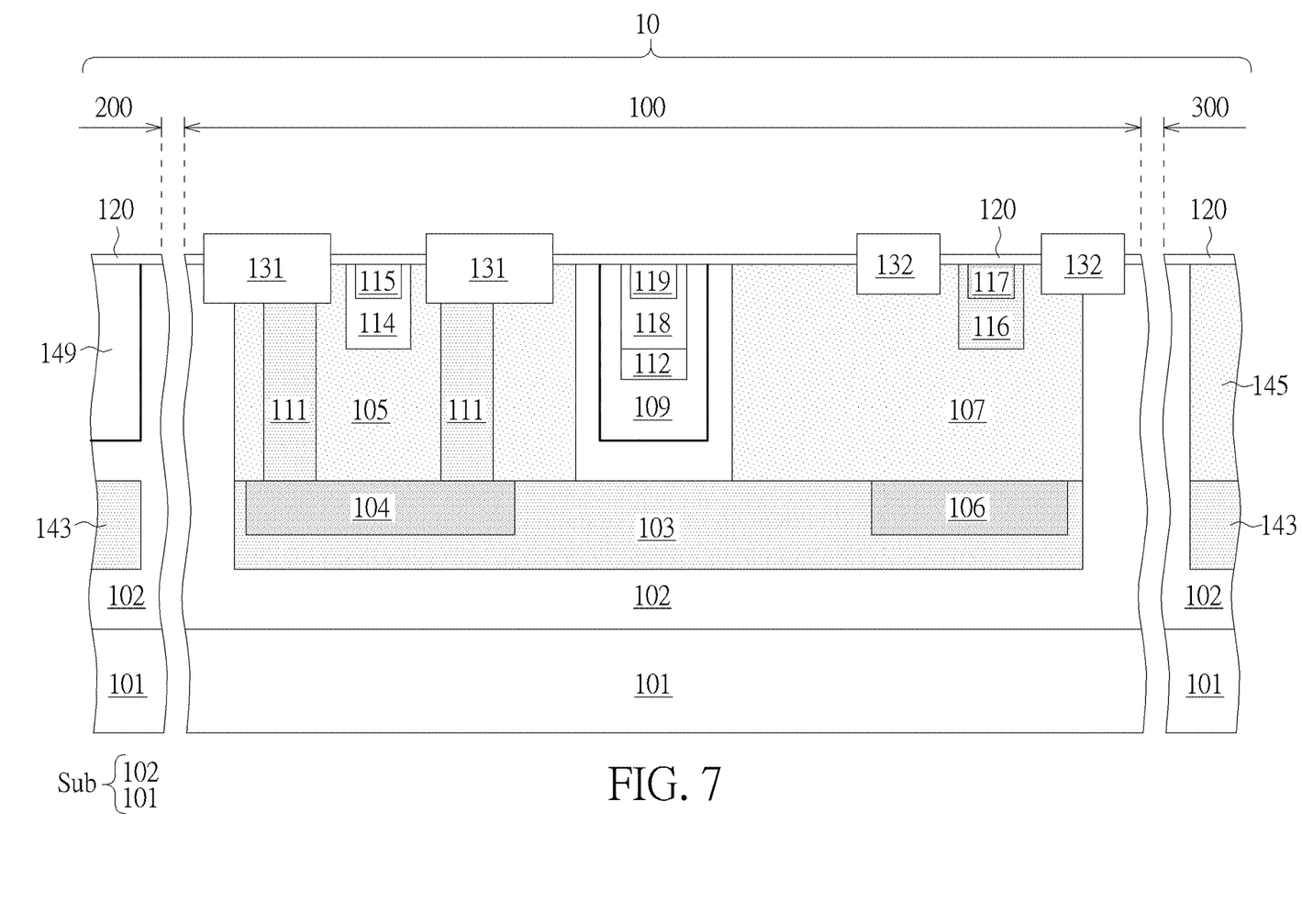

Next, as shown in FIG. 7, a dielectric layer 120 is formed on the surfaces of the regions of the diode structure 100 and the transistor structures 200 and 300. Then, a patterned hard mask (not shown) is formed on the dielectric layer 120, and the openings of the hard mask correspond to the predetermined regions for forming a first isolation region 131 and a second isolation region 132 of the diode structure 100. The region of the diode structure 100 is etched by an etching process to form trenches, the trenches are filled up with a dielectric material, and a chemical-mechanical planarization (CMP) process is performed thereon. Then, the hard mask is removed, and the first isolation region 131 and the second isolation region 132, such as shallow trench isolation (STI) structures are formed. The top surfaces of the first isolation region 131 and the second isolation region 132 may protrude from the top surface of the dielectric layer 120. In addition, although not shown in FIG. 7, the aforementioned processes of forming the first isolation region 131 and the second isolation region 132 may also be used to simultaneously form the other isolation regions in the regions of the transistor structures 200 and 300.

Subsequently, referring to FIG. 1 again, an anode 121, a cathode 123, a ground electrode 125, a first field plate 127 and a second field plate 129 are formed in the region of the diode structure 100. First, the dielectric layer 120 is etched to form openings to expose the first doped region 115, the second doped region 117 and the third doped region 119. Then, the same mask and the same deposition process are used to simultaneously form the anode 121, the cathode 123 and the ground electrode 125. In some embodiments, the materials of the anode 121, the cathode 123 and the ground electrode 125 may include metals, alloys, polysilicon or other conductive materials, such as aluminum, copper, magnesium, zinc, aluminum alloys, magnesium alloys, zinc alloys, etc. Afterwards, another mask and another deposition process are used to simultaneously form the first field plate 127 and the second field plate 129 in the region of the diode structure 100. In addition, other electrodes and field plates may also be formed in the regions accommodating the transistor structures 200 and 300 by using the processes of forming the anode 121, the cathode 123, the ground electrode 125, the first field plate 127 and the second field plate 129 of the diode structure 100.

According to the embodiments of the present disclosure, the process of fabricating the diode structure may be integrated with the BCD process of fabricating the transistor structures, and no additional photo-mask is required, thereby saving the fabrication time and cost of the semiconductor devices. In addition, the diode structure according to the embodiments of the present disclosure achieves the characteristics of both high breakdown voltage and low substrate leakage current, which is suitable for application in high-voltage integrated circuit chips. Moreover, through adjusting the doping concentrations of the well regions and the distances between the doped regions of the diode structure, the diode structures of the present disclosure meet the needs of different electronic products for various breakdown voltages.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A diode structure, comprising:
    a substrate, having a first conductivity type;
    a first well region, having a second conductivity type opposite to the first conductivity type, and disposed in the substrate;
    a first buried layer, having the second conductivity type and disposed under the first well region;
    a first doped region, having the first conductivity type, and disposed in the first well region;
    a ring-shaped well region, having the second conductivity type, disposed in the first well region, and surrounding the first doped region, wherein a doping concentration of the ring-shaped well region is higher than a doping concentration of the first well region, and a bottom surface of the ring-shaped well region is level with a bottom surface of the first well region;
    an anode, disposed on the first doped region;
    a second well region, having the second conductivity type, separated from the first well region, and disposed in the substrate;
    a second buried layer, having the second conductivity type and disposed under the second well region;
    a second doped region, having the second conductivity type, and disposed in the second well region;
    a cathode, disposed on the second doped region; and
    a third buried layer, having the second conductivity type, disposed in the substrate and extending laterally from below the first well region to below the second well region, wherein the first buried layer and the second buried layer are disposed in the third buried layer.

2. The diode structure of claim 1, further comprising:
    a third well region, having the first conductivity type, disposed in the substrate, located between the first well region and the second well region, and separated from the first well region and the second well region;
    a third doped region, having the first conductivity type, and disposed in the third well region; and
    a ground electrode, disposed on the third doped region.

3. The diode structure of claim 2, wherein a first distance is between the first doped region and the third doped region, a second distance is between the second doped region and the third doped region, and the second distance is greater than or equal to the first distance.

4. The diode structure of claim 3, wherein the second distance is 1 to 2 times the first distance.

5. The diode structure of claim 2, further comprising:
    a first field plate, extending laterally from above the first well region to above the third well region; and
    a second field plate, extending laterally from above the second well region to above the third well region, wherein the ground electrode is located between the first field plate and the second field plate.

6. The diode structure of claim 5, wherein the first field plate is located between the anode and the ground electrode, and the second field plate is located between the cathode and the ground electrode.

7. The diode structure of claim 5, further comprising:
    a first isolation region, disposed in the first well region, and surrounding the first doped region; and
    a second isolation region, disposed in the second well region, and surrounding the second doped region,
    wherein a portion of the first field plate is disposed on the first isolation region, and a portion of the second field plate is disposed on the second isolation region.

8. The diode structure of claim 1, wherein the first buried layer is in contact with the ring-shaped well region.

9. The diode structure of claim 8, wherein a doping concentration of the first buried layer is higher than the doping concentration of the first well region.

10. The diode structure of claim 8, wherein the second buried layer is separated from the first buried layer and in contact with the second well region.

11. The diode structure of claim 10, wherein a doping concentration of the second buried layer is higher than a doping concentration of the second well region.

12. The diode structure of claim 1, wherein a doping concentration of the first buried layer and a doping concentration of the second buried layer are higher than a doping concentration of the third buried layer.

13. The diode structure of claim 1, wherein the third buried layer is in contact with the first well region and the second well region.

14. The diode structure of claim 1, further comprising:
    a fourth doped region, having the first conductivity type, and disposed in the first well region, wherein the first doped region is disposed in the fourth doped region, and a doping concentration of the first doped region is higher than a doping concentration of the fourth doped region; and
    a fifth doped region, having the second conductivity type, and disposed in the second well region, wherein the second doped region is disposed in the fifth doped region, and a doping concentration of the second doped region is higher than a doping concentration of the fifth doped region.

15. The diode structure of claim 2, further comprising:
    a sixth doped region, having the first conductivity type, and disposed in the third well region, wherein the third doped region is disposed in the sixth doped region, and a doping concentration of the third doped region is higher than a doping concentration of the sixth doped region; and
    a seventh doped region, having the first conductivity type, disposed in the third well region, and under the sixth doped region, wherein a doping concentration of the seventh doped region is higher than the doping concentration of the sixth doped region and lower than the doping concentration of the third doped region.

16. The diode structure of claim 2, wherein a bottom surface of the third well region is higher than bottom surfaces of the first well region and the second well region.

17. The diode structure of claim 1, which is a bootstrap diode of a bootstrap circuit.

18. A semiconductor device, comprising:
    the diode structure of claim 1; and
    a transistor structure, comprising a bipolar junction transistor, a complementary metal-oxide-semiconductor transistor or a double-diffused metal-oxide-semiconductor transistor, wherein the transistor structure and the diode structure are disposed in the same substrate.

* * * * *